(12) United States Patent
Lozhkin et al.

(10) Patent No.: US 10,505,570 B2
(45) Date of Patent: Dec. 10, 2019

(54) DISTORTION COMPENSATING DEVICE AND DISTORTION COMPENSATION METHOD

(71) Applicant: FUJITSU LIMITED, Kawasaki-shi, Kanagawa (JP)

(72) Inventors: Alexander Nikolaevich Lozhkin, Kawasaki (JP); Hiroyoshi Ishikawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/169,442

(22) Filed: Oct. 24, 2018

(65) Prior Publication Data

US 2019/0132015 A1 May 2, 2019

(30) Foreign Application Priority Data

Oct. 31, 2017 (JP) ................................ 2017-211099
Sep. 12, 2018 (JP) ................................ 2018-170216

(51) Int. Cl.
*H04B 1/04* (2006.01)
*H04L 25/03* (2006.01)
(Continued)

(52) U.S. Cl.
CPC ......... *H04B 1/0475* (2013.01); *H03F 1/3247* (2013.01); *H03F 1/3294* (2013.01);
(Continued)

(58) Field of Classification Search
CPC ............. H03F 1/3247; H03F 2200/451; H03F 1/3294; H04B 1/62; H04B 1/0475;
(Continued)

(56) References Cited

U.S. PATENT DOCUMENTS

| 2006/0067426 A1* | 3/2006 | Maltsev et al. ......... H04L 25/49 375/297 |
| 2008/0211576 A1 | 9/2008 | Moffatt et al. |
| 2015/0146765 A1 | 5/2015 | Moffatt et al. |

FOREIGN PATENT DOCUMENTS

JP 2010-519862 A 6/2010

OTHER PUBLICATIONS

Ding, L, et al, "A Robust Digital Baseband Predistorter Constructed Using Memory Polynomials," IEEE Transactions on Communications, vol. 52, No. 1, pp. 159-165, Jan. 2004.

(Continued)

*Primary Examiner* — David S Huang
(74) *Attorney, Agent, or Firm* — Arent Fox LLP

(57) ABSTRACT

A distortion compensating device includes: a filter that receives input of a transmitting signal including a plurality of subcarrier signals assigned to respective frequencies and that superimposes filter coefficients on the respective subcarrier signals; a first signal converting unit that converts the subcarrier signals, on which the respective filter coefficients are superimposed, from a frequency domain into a time domain to obtain an input signal; a distortion compensating unit that superimposes a distortion compensation coefficient on the input signal to obtain an output signal; a power amplifier that amplifies and outputs the output signal; and a control unit that generates the filter coefficients according to an arithmetic equation using the subcarrier signals and a feedback signal from the power amplifier, and outputs the filter coefficients to the filter.

12 Claims, 12 Drawing Sheets

(51) Int. Cl.
  *H04L 5/00* (2006.01)
  *H03F 1/32* (2006.01)
  *H03F 3/24* (2006.01)

(52) U.S. Cl.
  CPC ............. *H03F 3/24* (2013.01); *H04L 5/0046* (2013.01); *H04L 25/03343* (2013.01); *H03F 2200/451* (2013.01)

(58) Field of Classification Search
  CPC ................ H04L 25/49; H04L 27/2602; H04L 25/03343; H04L 5/0046
  See application file for complete search history.

(56) References Cited

OTHER PUBLICATIONS

Ding, L, et al., "A Memory Polynomial Predistorter Implemented Using TMS320C67XX," Proceedings of Texas Instruments Developer Conference, 2004.
Hammi, O, et al., "Digital Subband Filtering Predistorter Architecture for Wireless Transmitters", IEEE Transactions on Microwave Theory and Techniques, vol. 53, No. 5, pp. 1643-1652, May 2005.
Chen, H, et al., "Joint Polynomial and Look-Up-Table Predistortion Power Amplifier Linearization", IEEE Transactions on Circuits and Systems-II: Express Briefs, vol. 53, No. 8, pp. 612-616, Aug. 2006.

* cited by examiner

| d={I,Q} | ADDRESS |
|---|---|
| -1, -1 | 0 |
| -1, +1 | 1 |
| +1, -1 | 2 |
| +1, +1 | 3 |

| AMPLITUDE | FILTER COEFFICIENT |
|---|---|
| $|d_k|_0$ | $w_{k,0}$ |
| $|d_k|_1$ | $w_{k,1}$ |
| $|d_k|_2$ | $w_{k,2}$ |

DISTORTION COMPENSATING DEVICE AND DISTORTION COMPENSATION METHOD

CROSS-REFERENCE TO RELATED APPLICATIONS

This application is based upon and claims the benefit of priority of the prior Japanese Patent Application No. 2017-211099, filed on Oct. 31, 2017 and Japanese Patent Application No. 2018-170216, filed on Sep. 12, 2018, the entire contents of which are incorporated herein by reference.

FIELD

The embodiment discussed herein is related to a distortion compensating device and a distortion compensation method.

BACKGROUND

In recent years, due to demands for multimedia services, or the like, the amount of information transmitted via a network has been increasing; therefore, there is a need for large-volume transmission systems. Furthermore, as one of the technologies for increasing a transmission capacity, wireless communication systems that use Orthogonal Frequency Division Multiplexing (OFDM) have been put into practical use. The wireless communication systems that use the OFDM are also called, for example, 4th-generation mobile communication systems or 4G systems. The standards of the 4G systems include, for example, Long Term Evolution (LTE) or LTE-Advanced (LTE-A). In the wireless communication system that uses the OFDM, signals in various multilevel modulation methods depending on usage are superimposed on subcarriers that are orthogonal to each other, and the signals are transmitted.

In the above-described wireless communication system, a power amplifier is used on the transmitting side for transmitting signals. The input/output characteristics of the power amplifier exhibit linearity if the output is small, and they exhibit nonlinearity due to saturation if the output is large. For example, if the power amplifier is operated at a high efficiency in the vicinity of the saturation range, the input/output characteristics of the power amplifier exhibit nonlinearity. Due to the nonlinearity, intermodulation distortion (IMD) occurs. The IMD is defined by amplitude modulation-amplitude modulation (AM-AM) type distortion (i.e., "amplitude distortion") and amplitude modulation-phase modulation (AM-PM) type distortion (i.e., "phase distortion"). If IMD occurs, an unnecessary distortion component leaks into an adjacent channel, and a distortion occurs in and out of the band of the signal. As a result, it causes interference.

Here, the techniques for compensating IMD of a power amplifier include Digital Pre-Distortion (DPD). The DPD is a process to superimpose a distortion compensation coefficient, which serves as a distortion component with the characteristics opposite to the nonlinear distortion characteristics of the power amplifier, on the signal before it is input to a power amplifier. The distortion compensation coefficient is referred to from the lookup table (LUT) on the basis of the instantaneous power of the signal that is input to the power amplifier.

[Non Patent Literature 1] L. Ding et al., "A Robust Digital Baseband Predistorter Constructed Using Memory Polynomials," IEEE TRANSACTIONS ON COMMUNICATIONS, VOL. 52, NO. 1, pp. 159-165, January 2004.

[Non Patent Literature 2] L. Ding et al., "A MEMORY POLYNOMIAL PREDISTORTER IMPLEMENTED USING TMS320C67XX," Proceedings of Texas Instruments Developer Conference, 2004.

[Non Patent Literature 3] O. Hammi et al., "Digital Sub-band Filtering Predistorter Architecture for Wireless Transmitters," IEEE TRANSACTIONS ON MICROWAVE THEORY AND TECHNIQUES, VOL. 53, NO. 5, pp. 1643-1652, MAY 2005.

[Non Patent Literature 4] Hsin-Hung Chen et al., "Joint Polynomial and Look-Up-Table Predistortion Power Amplifier Linearization," IEEE TRANSACTIONS ON CIRCUITS AND SYSTEMS-II: EXPRESS BRIEFS, VOL. 53, NO. 8, 612-616, AUGUST 2006.

However, not only in-band and out-of-band IMD based on the instantaneous power, but also in-band IMD, which occurs due to memory effect, is present in the IMD of a power amplifier. This is the distortion that occurs due to that the output of the power amplifier depends on not only the value of the signal (instantaneous power) currently input to the power amplifier, but also the value (log) of the signal previously input to the power amplifier. Therefore, there is a case where, in order to also compensate distortion that occurs due to the memory effect, a memory polynomial is applied to the DPD (see Non Patent Literatures 1 to 4). However, if a memory polynomial is applied to the DPD, the amount of calculations for distortion compensation is enormous, and the power consumption, which is consumed during signal processing such as calculations, is increased.

SUMMARY

According to an aspect of an embodiment, a distortion compensating device includes: a filter that receives input of a transmitting signal including a plurality of subcarrier signals assigned to respective frequencies and that superimposes filter coefficients on the respective subcarrier signals; a first signal converting unit that converts the subcarrier signals, on which the respective filter coefficients are superimposed, from a frequency domain into a time domain to obtain an input signal; a distortion compensating unit that superimposes a distortion compensation coefficient on the input signal to obtain an output signal; a power amplifier that amplifies and outputs the output signal; and a control unit that generates the filter coefficients according to an arithmetic equation using the subcarrier signals and a feedback signal from the power amplifier, and outputs the filter coefficients to the filter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Here, the disclosed technology is not limited to the following embodiments.

Here, a distortion compensating device according to a reference example is explained before an explanation on the distortion compensating device according to the present embodiment.

Reference Example

Figure 19:
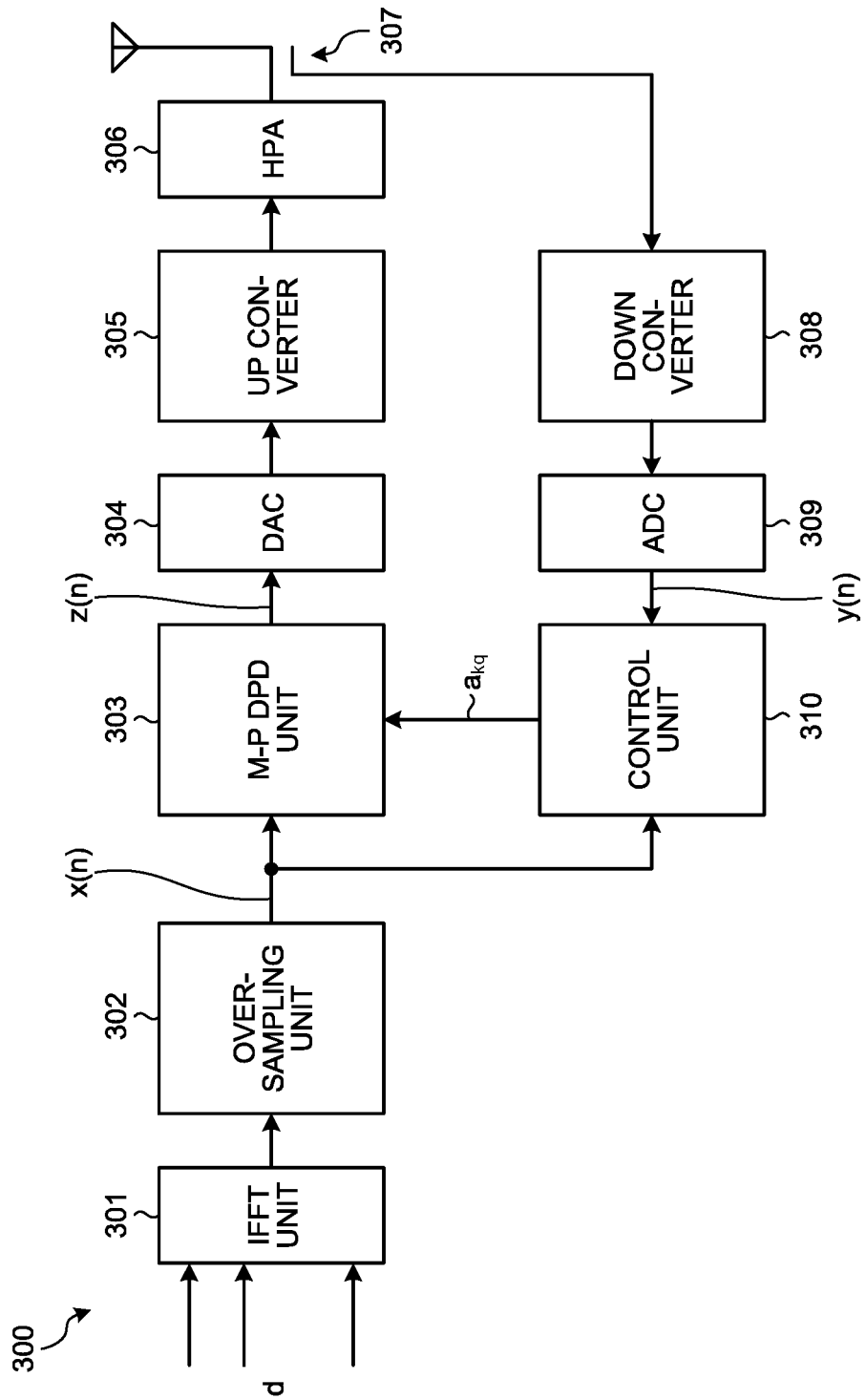
FIG. 19 is a block-diagram that illustrates an example of the configuration of a transmitting device according to a reference example.

FIG. 19 is a block-diagram that illustrates an example of the configuration of a transmitting device 300 according to the reference example. The transmitting device 300 includes a distortion compensating device that compensates IMD occurring in transmitting signals.

As illustrated in FIG. 19, the transmitting device 300 includes an inverse Fourier transform (Inverse Fast Fourier Transform: IFFT) unit 301 and an oversampling unit 302. Furthermore, the transmitting device 300 includes a Digital Pre-Distortion (DPD) unit 303 that uses a memory polynomial. Hereafter, the DPD unit 303, which uses a memory polynomial, is referred to as the "M-P DPD unit 303".

Furthermore, the transmitting device 300 includes a Digital to Analog Converter (DAC) 304, an up converter 305, a High Power Amplifier (HPA) 306, a directional coupler 307, a down converter 308, an Analog to Digital Converter (ADC) 309, and a control unit 310.

The IFFT unit 301 receives input of a mapped transmitting signal (vector) d. The transmitting signal d is a digital signal and is signals (hereafter, referred to as "subcarrier signals") that are assigned to N subcarriers at different frequencies. Here, the N subcarrier signals d are described as subcarrier signals $d_0$ to $d_{N-1}$.

The IFFT unit 301 conducts IFFT on modulation symbols of the N subcarrier signals $d_0$ to $d_{N-1}$. Thus, the symbols of the N subcarrier signals are converted from modulation symbols in the frequency domain into effective symbols in the time domain. The IFFT unit 301 outputs the signal, on which IFFT has been conducted, as an OFDM signal to the oversampling unit 302.

The oversampling unit 302 receives an input of the OFDM signal, output from the IFFT unit 301, and conducts oversampling on the input OFDM signal with a coefficient L (e.g., L=4). The oversampling unit 302 outputs the oversampled OFDM signal as an input signal x(n) to the M-P DPD unit 303 and the control unit 310.

Here, the input signal x(n) is represented by Equation (1). In Equation (1), j represents imaginary unit. f is the subcarrier spacing, and it represents 1/NT. NT denotes a symbol period.

$$xt \frac{1}{\sqrt{N}} \sum_{n=0}^{N-1} d_n e^{j2ft}, 0 \le t \le NT \qquad (1)$$

The M-P DPD unit 303 receives an input of the input signal x(n), output from the oversampling unit 302, and conducts DPD on the input signal x(n), which has been input, by using a memory polynomial (see Non Patent Literatures 1 to 4).

Specifically, the M-P DPD unit 303 receives a distortion compensation coefficient $a_{kq}$, which is output from the control unit 310. Then, the M-P DPD unit 303 superimposes (multiplies) the distortion compensation coefficient $a_{kq}$ on the input signal x(n). The distortion compensation coefficient $a_{kq}$ is equivalent to a distortion component with the characteristics opposite to the nonlinear distortion characteristics of the HPA 306. The M-P DPD unit 303 outputs the input signal x(n), on which the distortion compensation coefficient $a_{kq}$ is superimposed, as an output signal z(n) to the DAC 304.

Here, the output signal z(n) is represented by Equation (2). In Equation (2), $a_{kq}$ is the above-described distortion compensation coefficient. K is the highest order of nonlinear distortion assumed, and Q denotes the memory depth (the time axis direction). In the DPD that uses a memory polynomial, for example, Q=2 and K=5 (Non Patent Literature 1).

$$zn \sum_k^{KQ} \sum_{q0} a_{kq} xnq |xnq|^{k1} \qquad (2)$$

Furthermore, if Equation (2) is developed, the output signal z(n) is represented by Equation (3).

$$zn_{q0}^Q xnq_{k1}^K a_{kq}|xnq|^{k1} \quad (3)$$

The DAC 304 receives an input of the output signal z(n), which is a digital signal output from the M-P DPD unit 303. The DAC 304 converts the output signal z(n), which has been input, into an analog signal and outputs it to the up converter 305.

The up converter 305 receives an input of the signal that is output from the DAC 304. The up converter 305 up-converts the input signal to convert it into a radio frequency (RF) signal and outputs it to the HPA 306.

The HPA 306 amplifies the power of the signal, output from the up converter 305, and outputs it to the directional coupler 307. Here, intermodulation distortion (IMD) occurs in the HPA 306; however, the M-P DPD unit 303 (Q=2) has superimposed the distortion compensation coefficient $a_{kq}$ on the oversampled input signal x(n). For this reason, the signal output from the HPA 306 is a signal where in-band and out-of-band IMD based on the instantaneous power and in-band IMD that occurs due to the memory effect have been compensated.

The directional coupler 307 outputs the signal, output from the HPA 306, to an antenna. The antenna transmits the signal that is output from the directional coupler 307. Furthermore, the directional coupler 307 splits the signal, output from the HPA 306, and outputs it to the down converter 308.

The down converter 308 receives an input of the signal that is output from the directional coupler 307. The down converter 308 down-converts the input signal and outputs it to the ADC 309.

The ADC 309 receives an input of the signal that is output from the down converter 308. The ADC 309 converts the input signal into a digital signal and outputs it as a feedback signal y(n) to the control unit 310.

The control unit 310 receives an input of the input signal x(n) output from the oversampling unit 302 and receives an input of the feedback signal y(n) output from the ADC 309. The control unit 310 calculates the difference between the input signal x(n) and the feedback signal y(n), which have been input, and generates it as an error signal (n).

Here, the error signal (n) is represented by Equation (4).

$$n\ xn\ yn \quad (4)$$

The control unit 310 calculates the distortion compensation coefficient $a_{kq}$ so as to minimize the error signal (n) due to adaptive signal processing that uses the Least Mean Square (LMS) algorithm, or the like. The control unit 310 outputs the calculated distortion compensation coefficient $a_{kq}$ to the M-P DPD unit 303.

Here, the distortion compensation coefficient $a_{kq}$ is represented by Equation (5). In Equation (5), is a complex conjugation, and k is a step-size parameter used to control the tradeoff between the algorithm convergence speed and the residual error.

$$a_{kq}j1a_{kq}j_k n\ xn \quad (5)$$

In this manner, the M-P DPD unit 303 and the control unit 310 compensate IMD that occurs in transmitting signals of the transmitting device 300. That is, the distortion compensating device according to the reference example includes at least the M-P DPD unit 303 and the control unit 310. Here, the IMD of the power amplifier, such as the HPA 306, contains in-band IMD that occurs due to the memory effect as well as in-band and out-of-band IMD based on the instantaneous power. This is the distortion that occurs due to that the output of the power amplifier depends on the value (log) of the signal previously input to the power amplifier as well as the value of the signal (instantaneous power) currently input to the power amplifier. Therefore, there is a case where, in order to also compensate the distortion that occurs due to the memory effect, a memory polynomial is applied to the DPD as in the distortion compensating device according to the reference example. However, if a memory polynomial is applied to the DPD, the amount of calculations for distortion compensation is enormous, and the power consumption, which is consumed during signal processing such as calculation, is increased.

Thus, with the distortion compensating device according to the present embodiment, as an imbalance of the in-band IMD at a higher range side and a lower range side is recognized, a weight is superimposed on a transmitting signal at each frequency. For example, a Sub-band Finite Impulse Response (FIR) filter, described later, receives input of subcarrier signals, which are assigned to respective frequencies with respect to the transmitting signal, and superimposes filter coefficients as weights on the subcarrier signals. Thus, as a result, it is possible to compensate in-band IMD that occurs due to the memory effect.

Furthermore, with the distortion compensating device according to the present embodiment, the in-band IMD, which occurs due to the memory effect, is compensated by a Sub-band FIR filter, described later, so that the amount of calculations for distortion compensation is reduced. Thus, compared to the distortion compensating device according to the reference example, i.e., compared to a case where a memory polynomial is applied to DPD, the distortion compensating device according to the present embodiment makes it possible to reduce the power consumption that is consumed during signal processing such as calculation.

Furthermore, with the distortion compensating device according to the present embodiment, a memoryless (i.e., memory-effect less) DPD unit, described later, superimposes the distortion compensation coefficient $a_{kq}$ on the input signal x(n), thereby compensating in-band and out-of-band IMD based on the instantaneous power. Thus, with the distortion compensating device according to the present embodiment, it is possible to maintain the Error Vector Magnitude (EVM) and the Adjacent Channel Leakage Ratio (ACLR) at the same level as in the distortion compensating device according to the reference example.

[a] First Embodiment

Figure 1:
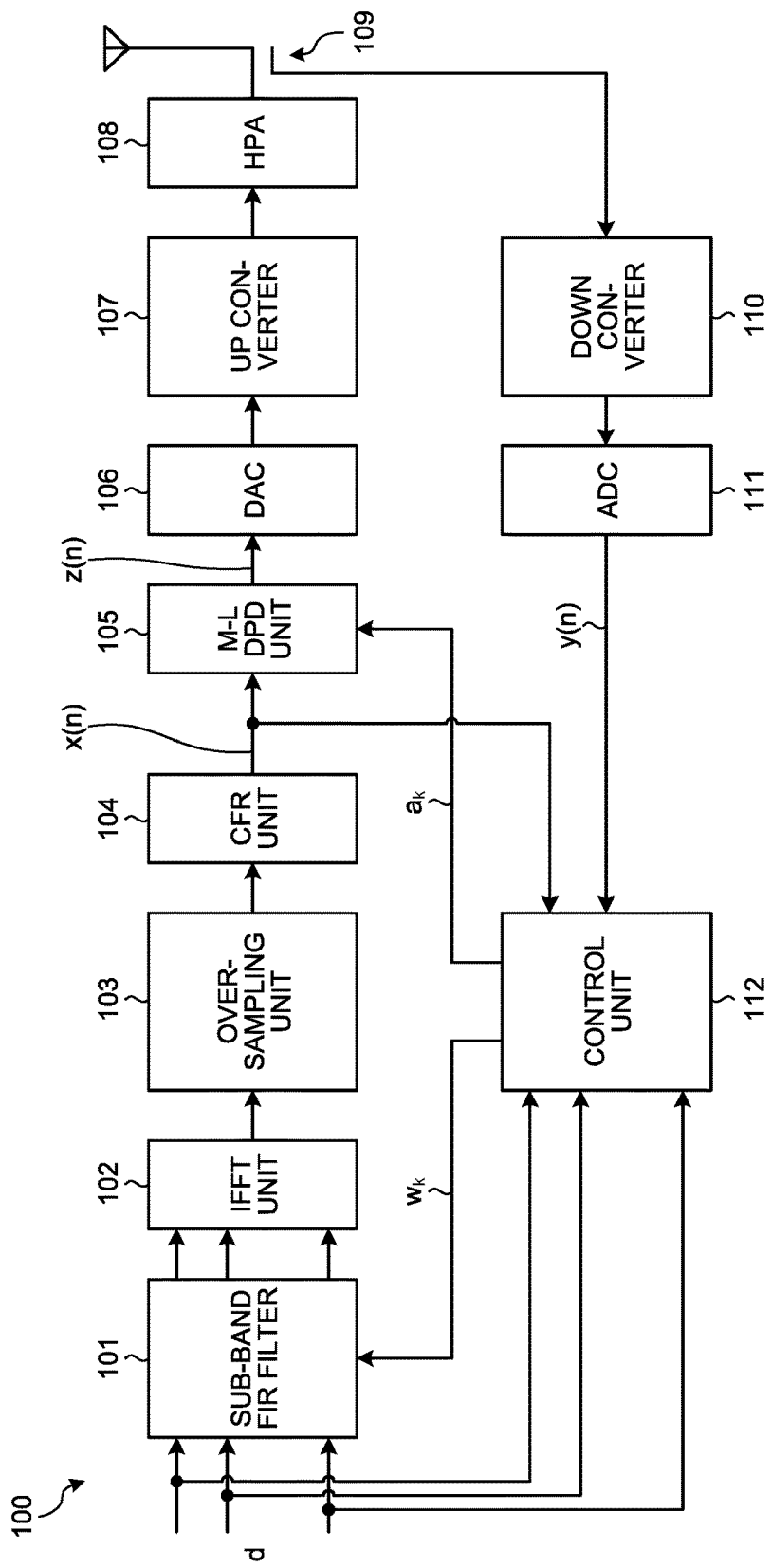
FIG. 1 is a block-diagram that illustrates an example of the configuration of a transmitting device according to a first embodiment.

FIG. 1 is a block-diagram that illustrates an example of the configuration of a transmitting device 100 according to a first embodiment.

As illustrated in FIG. 1, the transmitting device 100 includes a Sub-band FIR filter 101, an IFFT unit 102, an oversampling unit 103, and a Crest Factor Reduction (CFR) unit 104. The Sub-band FIR filter 101 is an example of a "filter unit". The IFFT unit 102 is an example of a "first signal converting unit".

Furthermore, the transmitting device 100 includes a memoryless DPD unit 105. The memoryless DPD unit 105 conducts typical DPD that does not compensate the influence of the memory effect. Hereafter, the memoryless DPD unit 105 is referred to as the "M-L DPD unit 105". The M-L DPD unit 105 is an example of a "distortion compensating unit".

Furthermore, the transmitting device 100 includes a DAC 106, an up converter 107, an HPA 108, a directional coupler 109, a down converter 110, an ADC 111, and a control unit 112. The transmitting device 100 includes a distortion compensating device that compensates IMD occurring in transmitting signals. That is, the transmitting device 100 includes the distortion compensating device including at least the Sub-band FIR filter 101, the M-L DPD unit 105, and the control unit 112.

The Sub-band FIR filter 101 receives input of the mapped transmitting signal (vector) d. The mapped transmitting signal d is a digital signal and is signals (hereafter, referred to as "subcarrier signals") that are assigned to N subcarriers at different frequencies. Here, the N subcarrier signals d are described as subcarrier signals $d_0$ to $d_{N-1}$, and the k-th subcarrier signal d is described as the subcarrier signal $d_k$.

Furthermore, the Sub-band FIR filter 101 receives input of N filter coefficients w that are the weights output from the control unit 112. Here, the N filter coefficients w are described as filter coefficients $w_0$ to $w_{N-1}$, and the k-th filter coefficient w is described as filter coefficient $w_k$.

The Sub-band FIR filter 101 superimposes (multiplies) the respective N filter coefficients $w_0$ to $w_{N-1}$ on the N subcarrier signals $d_0$ to $d_{N-1}$.

Figure 2:
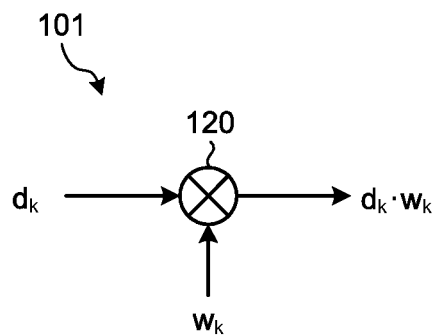
FIG. 2 is a diagram that illustrates an example of the configuration of a Sub-band FIR filter in a distortion compensating device according to the first embodiment.
Figure 3:
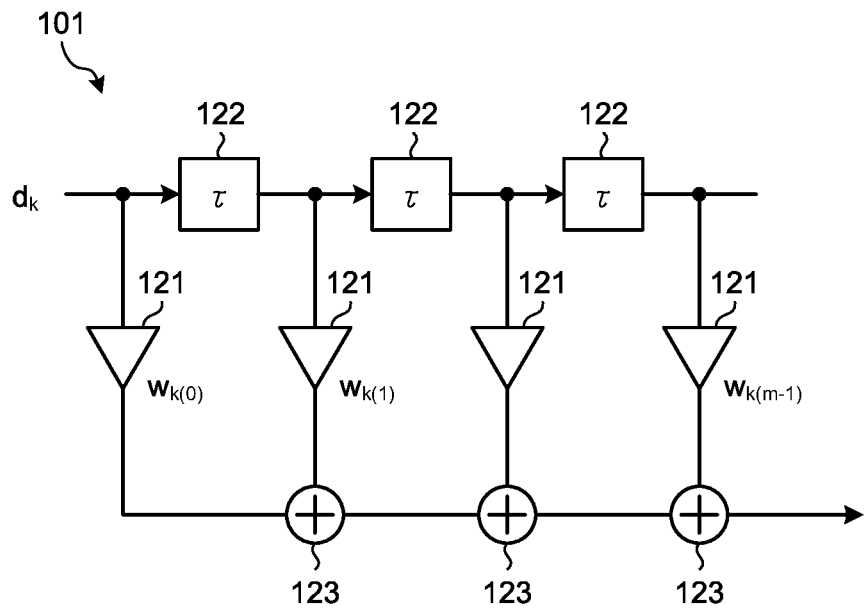
FIG. 3 is a diagram that illustrates an example of the configuration of the Sub-band FIR filter in the distortion compensating device according to the first embodiment.

FIG. 2 and FIG. 3 are diagrams that illustrate an example of the configuration of the Sub-band FIR filter 101 in the distortion compensating device according to the first embodiment.

The Sub-band FIR filter 101 has a 1-tap configuration as illustrated in FIG. 2. In this case, the Sub-band FIR filter 101 includes N multipliers 120. For example, among the N multipliers 120, the k-th multiplier 120 receives input of the k-th subcarrier signal $d_k$ out of the N subcarrier signals $d_0$ to $d_{N-1}$ and the k-th filter coefficient $w_k$ out of the N filter coefficients $w_0$ to $w_{N-1}$. Then, the k-th multiplier 120 multiplies the k-th subcarrier signal $d_k$ by the k-th filter coefficient $w_k$.

Alternatively, the Sub-band FIR filter 101 may have an m-tap configuration as illustrated in FIG. 3. In this case, the Sub-band FIR filter 101 includes m-tap multipliers 121, (m−1) delay devices 122, and (m−1) adders 123. The m-tap multipliers 121 are provided in parallel from the 0th to the (m−1)th. The (m−1) delay devices 122 are serially connected to delay signals by time. The outputs of the (m−1) delay devices 122 are connected to the inputs of the 1st to the (m−1)th multipliers 121, respectively, included in the m-tap multipliers 121. The (m−1) adders 123 are serially connected. The k-th subcarrier signal $d_k$ is multiplied by the filter coefficients $w_{k(0)}$ to $w_{k(m-1)}$ as filter coefficients $w_k$ by the m multipliers 121, and the outputs of the m multipliers 121 are combined by the (m−1) adders 123.

In FIG. 1, the Sub-band FIR filter 101 outputs the N subcarrier signals $d_0$ to $d_{N-1}$, on which the N filter coefficients $w_0$ to $w_{N-1}$ are superimposed, respectively, to the IFFT unit 102.

The IFFT unit 102 receives an input of the N subcarrier signal that is output from the Sub-band FIR filter 101. The IFFT unit 102 conducts IFFT on modulation symbols of the N subcarrier signals. Thus, the symbols of the N subcarrier signals are converted from modulation symbols in the frequency domain into effective symbols in the time domain. The IFFT unit 102 outputs the signal, on which the IFFT has been conducted, as an OFDM signal to the oversampling unit 103.

The oversampling unit 103 receives an input of the OFDM signal output from the IFFT unit 102 and conducts oversampling on the input OFDM signal with the coefficient L. The oversampling unit 103 outputs the oversampled OFDM signal as the input signal x(n) to the M-L DPD unit 105 and the control unit 112 via the CFR unit 104. The input signal x(n) passes through the CFR unit 104 so that the peak power of the input signal x(n) is suppressed due to clipping, or the like.

The M-L DPD unit 105 receives an input of the input signal x(n), which is output from the oversampling unit 103 via the CFR unit 104, and superimposes the distortion compensation coefficient $a_k$ on the input signal x(n), which has been input.

Specifically, the M-L DPD unit 105 receives the distortion compensation coefficient $a_k$ output from the control unit 112. Then, the M-L DPD unit 105 superimposes (multiplies) the distortion compensation coefficient $a_k$ on the input signal x(n). The distortion compensation coefficient $a_k$ is equivalent to a distortion component with the characteristics opposite to the nonlinear distortion characteristics of the HPA 108. The M-L DPD unit 105 outputs the input signal x(n), on which the distortion compensation coefficient $a_k$ is superimposed, as the output signal z(n) to the DAC 106.

Here, with the memoryless DPD, Q in the above-described Equation (2) is 0 (Q=0), and therefore according to the present embodiment the distortion compensation coefficient $a_{kq}$ in the above-described Equations (2), (3) is described as the distortion compensation coefficient $a_k$.

The DAC 106 receives an input of the output signal z(n) that is a digital signal output from the M-L DPD unit 105. The DAC 106 converts the output signal z(n), which has been input, into an analog signal and outputs it to the up converter 107.

The up converter 107 receives an input of the signal that is output from the DAC 106. The up converter 107 up-converts the input signal to convert it into a radio frequency (RF) signal and outputs it to the HPA 108.

The HPA 108 amplifies the power of the signal, output from the up converter 107, and outputs it to the directional coupler 109. Here, intermodulation distortion (IMD) occurs in the HPA 108; however, the Sub-band FIR filter 101 has superimposed the N filter coefficients $w_0$ to $w_{N-1}$ on the N subcarrier signals $d_0$ to $d_{N-1}$, respectively. For this reason, the signal output from the HPA 108 is consequently a signal that has compensated the in-band IMD occurring due to the memory effect. Furthermore, the M-L DPD unit 105 (Q=0) has superimposed the distortion compensation coefficient $a_k$ on the oversampled input signal x(n). For this reason, the signal output from the HPA 108 is a signal that has compensated in-band and out-of-band IMD based on the instantaneous power.

The directional coupler 109 outputs the signal, output from the HPA 108, to an antenna. The antenna transmits the signal output from the directional coupler 109. Furthermore, the directional coupler 109 splits the signal, output from the HPA 108, and outputs it to the down converter 110.

The down converter 110 receives an input of the signal that is output from the directional coupler 109. The down converter 110 down-converts the input signal and outputs it to the ADC 111.

The ADC 111 receives an input of the signal that is output from the down converter 110. The ADC 111 converts the input signal into a digital signal and outputs it as the feedback signal y(n) to the control unit 112.

The control unit 112 receives an input of the input signal x(n) that is output from the CFR unit 104. Furthermore, the control unit 112 receives an input of the feedback signal y(n) that is output from the ADC 111. The control unit 112 uses the above-described Equation (4) to calculate the difference between the input signal x(n) and the feedback signal y(n) and generate it as the error signal (n). Then, the control unit 112 uses the above-described Equation (5) to calculate the distortion compensation coefficient $a_k$ so as to minimize the error signal (n) due to adaptive signal processing that uses the LMS algorithm, or the like. The control unit 112 outputs the calculated distortion compensation coefficient $a_k$ to the M-L DPD unit 105.

Here, with the memoryless DPD, Q in the above-described Equation (2) is 0 (Q=0), and therefore according to the present embodiment the distortion compensation coefficient $a_{kq}$ in the above-described Equation (5) is described as the distortion compensation coefficient $a_k$.

Furthermore, the control unit 112 receives an input of the mapped transmitting signal (vector) d. As described above, the transmitting signal d is the subcarrier signals $d_0$ to $d_{N-1}$ that are assigned to the N subcarriers at different frequencies. Furthermore, the control unit 112 generates the N filter coefficients $w_0$ to $w_{N-1}$ according to arithmetic equations (Equation (6) and Equation (7) described later) that use the N subcarrier signals $d_0$ to $d_{N-1}$, which are the transmitting signal d, and the feedback signal y(n).

Figure 4:
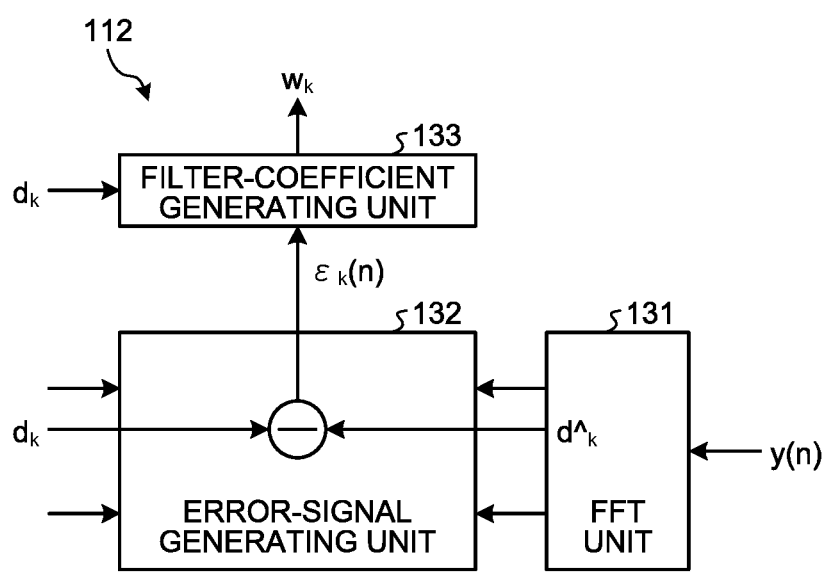
FIG. 4 is a diagram that illustrates an example of the configuration of a control unit in the distortion compensating device according to the first embodiment.

For example, with the configuration illustrated in FIG. 4, the control unit 112 generates the N filter coefficients $w_0$ to $w_{N-1}$.

FIG. 4 is a diagram that illustrates an example of the configuration of the control unit 112 in the distortion compensating device according to the first embodiment. As illustrated in FIG. 4, the control unit 112 includes a Fourier Transform (Fast Fourier Transform: FFT) unit 131, an error-signal generating unit 132, and a filter-coefficient generating unit 133. The FFT unit 131 is an example of a "second signal converting unit".

The FFT unit 131 receives an input of the feedback signal y(n) that is output from the ADC 111. Then, the FFT unit 131 converts the feedback signal y(n) from the time domain into the frequency domain and outputs signals $d\hat{}_0$ to $d\hat{}_{N-1}$, which have been converted into the frequency domain, to the error-signal generating unit 132.

The error-signal generating unit 132 receives input of the N subcarrier signals $d_0$ to $d_{N-1}$ that are the transmitting signal d. Furthermore, the error-signal generating unit 132 receives input of the signals $d\hat{}_0$ to $d\hat{}_{N-1}$, which are output from the FFT unit 131. The error-signal generating unit 132 includes N subtractors. The N subtractors calculate the difference between the N subcarrier signals $d_0$ to $d_{N-1}$ and the signals $d\hat{}_0$ to $d\hat{}_{N-1}$ and outputs them as N error signals $_0(n)$ to $_{N-1}(n)$.

Here, among the N error signals $_0(n)$ to $_{N-1}(n)$, the k-th error signal $_k(n)$ is represented by Equation (6).

$$_k n\ d_k d_k \qquad (6)$$

The filter-coefficient generating unit 133 receives input of the N subcarrier signals $d_0$ to $d_{N-1}$, which are the transmitting signal d. Furthermore, the filter-coefficient generating unit 133 receives input of the N error signals $_0(n)$ to $_{N-1}(n)$ that are output from the error-signal generating unit 132. The filter-coefficient generating unit 133 generates the N filter coefficients $w_0$ to $w_{N-1}$ according to the arithmetic equation that uses the N error signals $_0(n)$ to $_{N-1}(n)$ and the N subcarrier signals $d_0$ to $d_{N-1}$. The filter-coefficient generating unit 133 outputs the generated N filter coefficients $w_0$ to $w_{N-1}$ to the Sub-band FIR filter 101.

Here, among the N filter coefficients $w_0$ to $w_{N-1}$, the k-th filter coefficient $w_k$ is represented by Equation (7). In Equation (7), * is a complex conjugation, and $_k$ is a step-size parameter used to control the tradeoff between the algorithm convergence speed and the residual error.

$$w_k j1 w_{jkk} n\ d_k^* \qquad (7)$$

Figure 5:
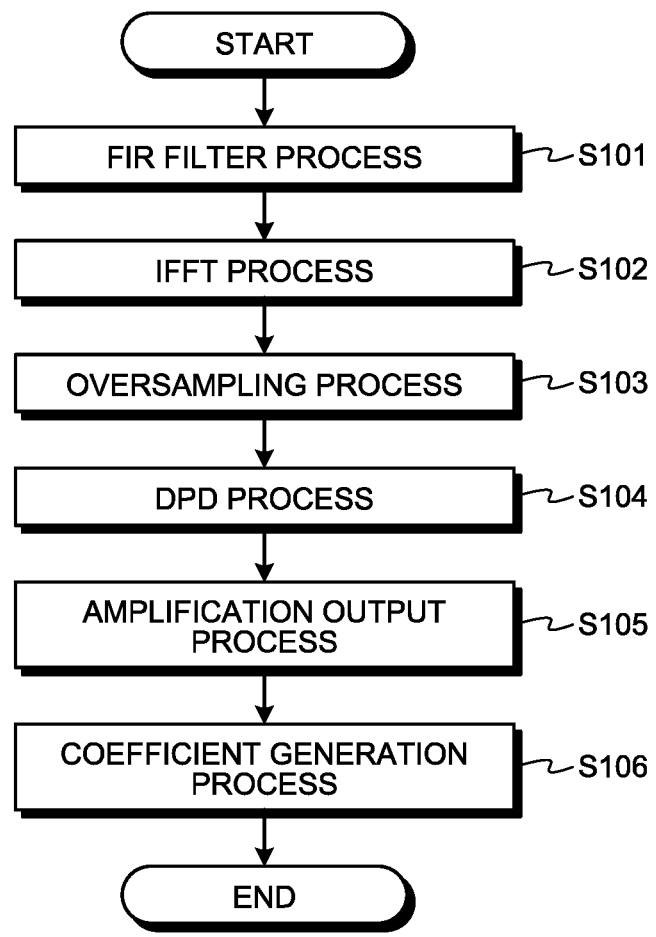
FIG. 5 is a flow-chart that illustrates an example of a process (distortion compensation method) of the distortion compensating device according to the first embodiment.

FIG. 5 is a flow-chart that illustrates an example of a process (distortion compensation method) of the distortion compensating device according to the first embodiment.

First, a FIR filter process (Step S101) is performed. During the process, the Sub-band FIR filter 101 receives input of the N subcarrier signals $d_0$ to $d_{N-1}$ assigned to respective frequencies with respect to the transmitting signal d and superimposes the N filter coefficients $w_0$ to $w_{N-1}$ on the respective N subcarrier signals $d_0$ to $d_{N-1}$.

Next, the IFFT process (Step S102) is performed. During the process, the IFFT unit 102 converts the N subcarrier signals do to $d_{N-1}$, on which the respective N filter coefficients $w_0$ to $w_{N-1}$ are superimposed, from the frequency domain into the time domain.

Then, the oversampling process (Step S103) is performed. During the process, the oversampling unit 103 conducts oversampling on the signal, which has been converted into the time domain, and outputs it as the input signal x(n) to the M-L DPD unit 105 and the control unit 112 via the CFR unit 104.

Then, the DPD process (Step S104) is performed. During the process, the M-L DPD unit 105 superimposes the distortion compensation coefficient $a_k$ on the input signal x(n) and outputs it as the output signal z(n) to the DAC 106.

Then, the amplification output process (Step S105) is performed. During the process, the DAC 106 converts the output signal z(n) into an analog signal and outputs it to the HPA 108 via the up converter 107. The HPA 108 amplifies the power of the signal, output from the up converter 107, and outputs it. The directional coupler 109 outputs the signal, output from the HPA 108, to the antenna and outputs it to the ADC 111 via the down converter 110. The ADC 111 converts the signal, output from the down converter 110, into a digital signal and outputs it as the feedback signal y(n) to the control unit 112.

Then, the coefficient generation process (Step S106) is performed. During the process, the control unit 112 generates the N filter coefficients $w_0$ to $w_{N-1}$ according to the arithmetic equations (see the above-described Equation (6) and Equation (7)) that uses the N subcarrier signals $d_0$ to $d_{N-1}$ and the feedback signal y(n) and outputs them to the Sub-band FIR filter 101. The control unit 112 generates the distortion compensation coefficient $a_k$ according to the arithmetic equation (see the above-described Equation (4) and Equation (5)) that uses the input signal x(n) and the feedback signal y(n) and outputs it to the M-L DPD unit 105.

As described above, in the distortion compensating device according to the first embodiment, the Sub-band FIR filter 101 receives input of the N subcarrier signals $d_0$ to $d_{N-1}$, which are assigned to the respective frequencies with respect to the transmitting signal d, and superimposes the filter coefficients $w_0$ to $w_{N-1}$ on the respective N subcarrier signals $d_0$ to $d_{N-1}$. Thus, as a result, it is possible to compensate in-band IMD that occurs due to the memory effect.

Furthermore, with the distortion compensating device according to the first embodiment, the Sub-band FIR filter 101 compensates in-band IMD that occurs due to the memory effect, whereby the amount of calculations for distortion compensation is reduced. Thus, compared to the distortion compensating device according to the reference example, i.e., compared to a case where a memory polynomial is applied to DPD, the distortion compensating device according to the first embodiment makes it possible to reduce the power consumption that is consumed during signal processing such as calculation.

Furthermore, with the distortion compensating device according to the first embodiment, the M-L DPD unit 105 superimposes the distortion compensation coefficient $a_k$ on the oversampled input signal x(n), thereby compensating in-band and out-of-band IMD based on the instantaneous power. Thus, with the distortion compensating device according to the first embodiment, it is possible to maintain the EVM and the ACLR at the same level as in the distortion compensating device according to the reference example.

[b] Second Embodiment

In the distortion compensating device according to the first embodiment, the control unit 112 uses the configuration illustrated in FIG. 4 to generate the N filter coefficients $w_0$ to $w_{N-1}$; however, this is not a limitation. For example, in the distortion compensating device according to the second embodiment, the control unit 112 may use the following configuration to generate the N filter coefficients $w_0$ to $w_{N-1}$. In the second embodiment, the same components as those in the first embodiment are attached with the same reference numerals, and their explanations are omitted.

Figure 6:
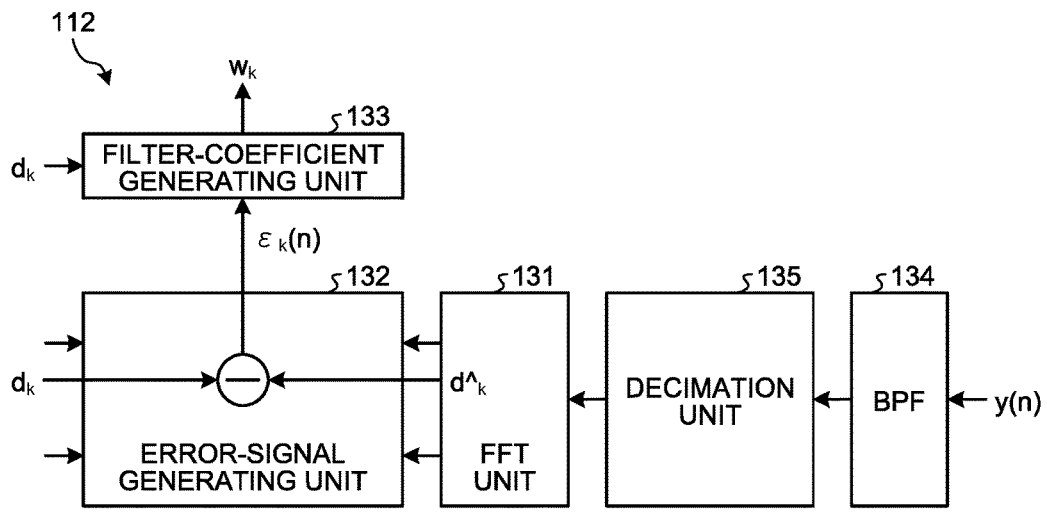
FIG. 6 is a diagram that illustrates an example of the configuration of the control unit in the distortion compensating device according to a second embodiment.

FIG. 6 is a diagram that illustrates an example of the configuration of the control unit 112 in the distortion compensating device according to the second embodiment. As illustrated in FIG. 6, the control unit 112 further includes a band-pass filter (BPF) 134 and a decimation unit 135 in addition to the configuration in FIG. 4. The BPF 134 is an example of a "band limiting unit".

The BPF 134 receives an input of the feedback signal y(n) that is output from the ADC 111. Then, the BPF 134 passes a signal in a specific frequency band with respect to the feedback signal y(n) and attenuates signals in other frequency bands.

The decimation unit 135 decimates the feedback signal y(n) that has passed the BPF 134. Then, the decimation unit 135 outputs the decimated feedback signal y(n) to the FFT unit 131.

The FFT unit 131 receives an input of the feedback signal y(n) that is output from the decimation unit 135. Then, the FFT unit 131 converts the feedback signal y(n) from the time domain into the frequency domain and outputs the signals $\hat{d}_0$ to $\hat{d}_{N-1}$, which have been converted into the frequency domain, to the error-signal generating unit 132. The error-signal generating unit 132 calculates the difference between the N subcarrier signals $d_0$ to $d_{N-1}$, which are the transmitting signal d, and the signals $\hat{d}_0$ to $\hat{d}_{N-1}$, which are output from the FFT unit 131, and outputs them as N error signals $_0(n)$ to $_{N-1}(n)$. The filter-coefficient generating unit 133 generates the N filter coefficients $w_0$ to $w_{N-1}$ according to the arithmetic equation (the above-described Equation (7)) that uses the N subcarrier signals $d_0$ to $d_{N-1}$, which are the transmitting signal d, and the N error signals $_0(n)$ to $_{N-1}(n)$, which are output from the error-signal generating unit 132. The filter-coefficient generating unit 133 outputs the generated N filter coefficients $w_0$ to $w_{N-1}$ to the Sub-band FIR filter 101.

If signals are continuously oversampled, the sampling frequency is high and the scale of the subsequent signal processing is larger than that in a case where oversampling is not conducted. For this reason, decimation is conducted on the feedback signal y(n) that has passed the BPF 134. Thus, in the control unit 112 illustrated in FIG. 6, the size of the FFT unit 131 may be reduced as compared to the configuration in FIG. 4.

[c] Third Embodiment

In the distortion compensating device according to the first embodiment and the second embodiment, the control unit 112 uses the configurations illustrated in FIGS. 4 and 6 to generate the N filter coefficients $w_0$ to $w_{N-1}$; however, this is not a limitation. For example, in the distortion compensating device according to a third embodiment, the control unit 112 may use the following configuration to generate the N filter coefficients $w_0$ to $w_{N-1}$. In the third embodiment, the same components as those in the first embodiment and the second embodiment are attached with the same reference numerals, and their explanations are omitted.

Figure 7:
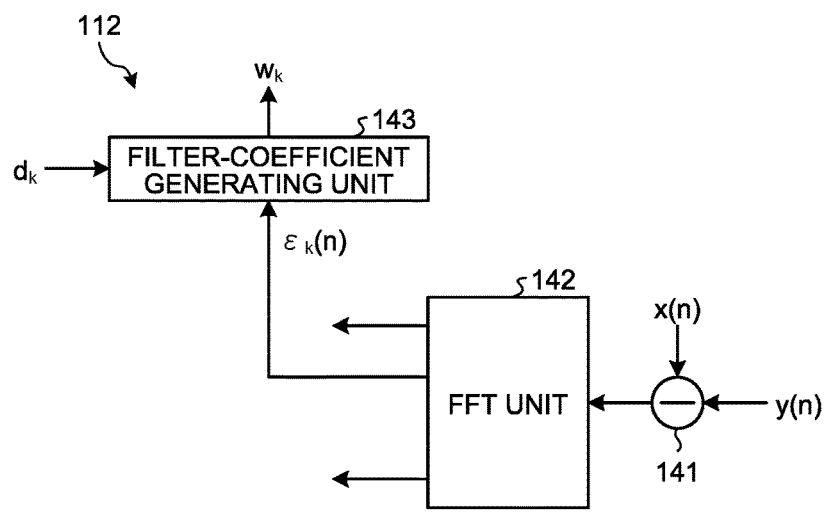
FIG. 7 is a diagram that illustrates an example of the configuration of the control unit in the distortion compensating device according to a third embodiment.

FIG. 7 is a diagram that illustrates an example of the configuration of the control unit 112 in the distortion compensating device according to the third embodiment. As illustrated in FIG. 7, the control unit 112 includes an error-signal generating unit 141, an FFT unit 142, and a filter-coefficient generating unit 143. The FFT unit 142 is an example of a "second signal converting unit".

The error-signal generating unit 141 receives an input of the input signal x(n) that is output from the oversampling unit 103. Furthermore, the error-signal generating unit 141 receives an input of the feedback signal y(n) that is output from the ADC 111. The error-signal generating unit 141 is a subtractor. The error-signal generating unit 141 calculates the difference between the input signal x(n) and the feedback signal y(n) and outputs it as an error signal.

The FFT unit 142 receives an input of the error signal that is output from the error-signal generating unit 141. Then, the FFT unit 142 converts the error signal from the time domain into the frequency domain and outputs the N signals $_0(n)$ to $_{N-1}(n)$, which have been converted into the frequency domain, as the error signals to the filter-coefficient generating unit 143.

The filter-coefficient generating unit 143 receives input of the N subcarrier signals $d_0$ to $d_{N-1}$, which are the transmitting signal d. Furthermore, the filter-coefficient generating unit 143 receives input of the N error signals $_0(n)$ to $_{N-1}(n)$ that are output from the FFT unit 142. The filter-coefficient generating unit 143 generates the N filter coefficients $w_0$ to $w_{N-1}$ according to the arithmetic equation (see the above-described Equation (7)) that uses the N error signals $_0(n)$ to $_{N-1}(n)$ and the N subcarrier signals $d_0$ to $d_{N-1}$. The filter-coefficient generating unit 143 outputs the generated N filter coefficients $w_0$ to $w_{N-1}$ to the Sub-band FIR filter 101.

[d] Fourth Embodiment

In the distortion compensating device according to the first embodiment to the third embodiment, the control unit 112 generates the distortion compensation coefficient $a_k$ according to the arithmetic equation (the above-described Equation (4), Equation (5)) that uses the input signal x(n) and the feedback signal y(n); however, this is not a limitation. For example, in the distortion compensating device according to a fourth embodiment, the control unit 112 may generate the distortion compensation coefficient $a_k$ by using the N error signals $_0(n)$ to $_{N-1}(n)$ that are illustrated in the first embodiment to the third embodiment. In the fourth embodiment, the same components as those in the first embodiment to the third embodiment are attached with the same reference numerals, and their explanations are omitted.

In this case, the control unit 112 generates, as the error signal (n), the sum of the N error signals $_0(n)$ to $_{N-1}(n)$ that are generated by the error-signal generating unit 132 (FIG. 4, FIG. 6) or the FFT unit 142 (FIG. 7).

Here, the error signal (n) is represented by Equation (8) instead of the above-described Equation (4).

$$n_{n\ 0}^{N1}(d_k^\wedge\ d_k)_{k\ 0k}^{N1}n \tag{8}$$

Furthermore, the control unit 112 uses the above-described Equation (5) to calculate the distortion compensation coefficient $a_k$ so as to minimize the error signal (n) due to adaptive signal processing that uses the LMS algorithm, or the like.

[e] Fifth Embodiment

In the distortion compensating device according to the first embodiment to the fourth embodiment, the Sub-band FIR filter 101 includes the N multipliers 120 if it has for example 1-tap configuration. In this case, as the number N of the multipliers 120 is larger, the number of signals for feeding the N filter coefficients $w_0$ to $w_{N-1}$ from the control unit 112 to the N multipliers 120 is larger; thus, the circuit size of the Sub-band FIR filter 101 becomes larger. An explanation is given of the method for reducing the circuit size of the Sub-band FIR filter 101 in the distortion compensating device according to a fifth embodiment.

First, in the distortion compensating device according to the fifth embodiment, the number of filter coefficients is reduced to decrease the circuit size of the Sub-band FIR filter 101.

Figure 8:
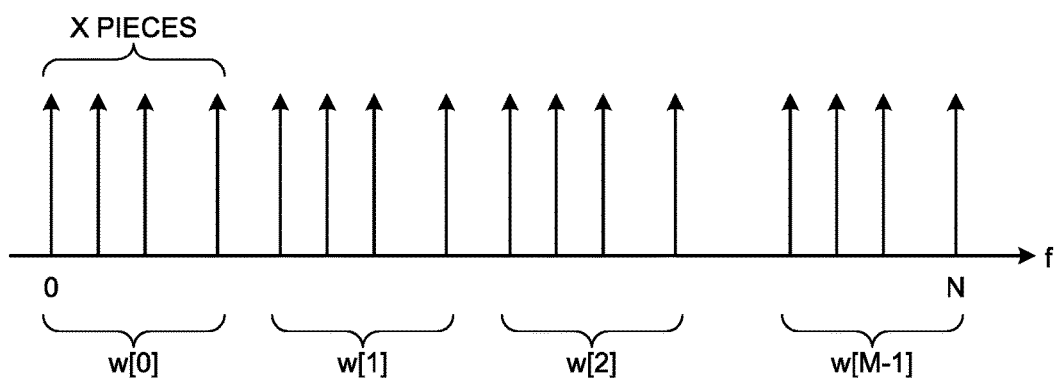
FIG. 8 is a diagram that illustrates an example of grouped subcarrier signals in the distortion compensating device according to a fifth embodiment.
Figure 9:
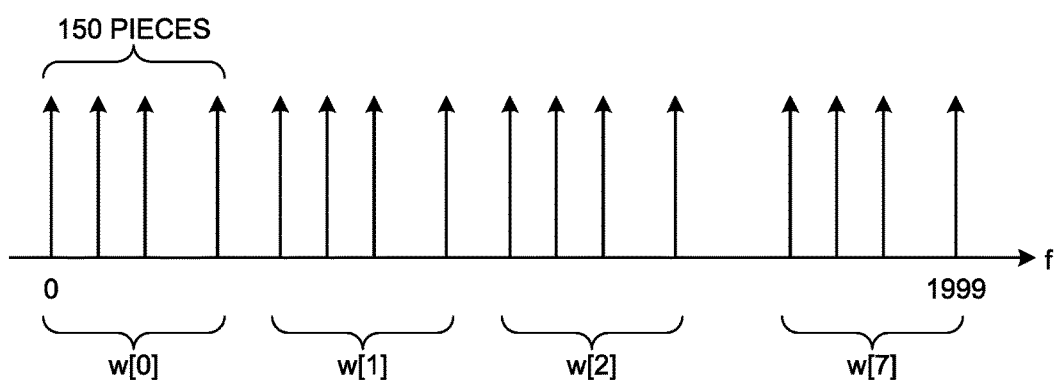
FIG. 9 is a diagram that illustrates an example of grouped subcarrier signals in the distortion compensating device according to a fifth embodiment.

FIG. 8 and FIG. 9 are diagrams that illustrate an example of grouped subcarrier signals in the distortion compensating device according to the fifth embodiment. In FIG. 8 and FIG. 9, the horizontal axis is the frequency f, and it indicates the number N of subcarriers. The vertical axis indicates a subcarrier signal.

Generally, a unique filter coefficient is assigned to each subcarrier, i.e., each of the subcarrier signals $d_0$ to $d_{N-1}$. However, the frequency interval (subcarrier spacing) between subcarriers is relatively small. For example, the subcarrier spacing with regard to LTE signals is 15 kHz. Therefore, it may be assumed that the weights of adjacent subcarriers are correlated and the filter coefficient of the same value is assignable to the adjacent subcarriers.

Therefore, in the distortion compensating device according to the fifth embodiment, as illustrated in FIG. 8, the N subcarriers, i.e., the N subcarrier signals $d_0$ to $d_{N-1}$, are divided into M groups by X adjacent subcarriers. In this case, N, X, and M are integers that satisfy M=N/X. Furthermore, in the distortion compensating device according to the fifth embodiment, M filter coefficients w[0] to w[M−1] are generated, which are each set to the identical value for the X adjacent subcarriers in each of the M groups.

For example, if the LTE signal is a signal of 20 MHz, N, X, and M are 1200, 150, 8, respectively, as illustrated in FIG. 9. Specifically, the 1200 subcarrier signal $d_0$ to $d_{N-1}$ are split into 8 groups by 150 adjacent subcarriers. In this case, 8 filter coefficients w[0] to w[7] are generated, which are each set to the identical value for 150 adjacent subcarriers in each group.

Here, a case where the control unit 112 has the configuration illustrated in the first embodiment or the second embodiment is assumed. In this case, the error-signal generating unit 132 generates M error signals $_k(n)$ according to the arithmetic equation that uses the above-described M subcarrier signals $d_k$ in the M groups, and the signals $d^\wedge_k$, which are converted into a frequency domain by the FFT unit 131 for the respective M groups.

Here, the M error signal $_k(n)$ is represented by Equation (9). In Equation (9), the error signal $_k(n)$ has the same weight (the same value) for the X adjacent subcarriers (subcarrier index from −X/2 to X/2)

$$_k n d_k^\wedge\ \frac{1}{X} \sum_{i\ X/2}^{X/2} d_{ki} \tag{9}$$

The filter-coefficient generating unit 133 generates the M filter coefficients w[0] to w[M−1] as the above-described N filter coefficients $w_0$ to $w_{N-1}$ according to the arithmetic equation (the above-described Equation (7)) that uses the M error signals $_k(n)$ and the subcarrier signals $d_k$ in the M groups. The filter-coefficient generating unit 133 outputs the generated M filter coefficients w[0] to w[M−1] to the Sub-band FIR filter 101.

The Sub-band FIR filter 101 receives input of the N subcarrier signals $d_0$ to $d_{N-1}$, which are assigned to the respective frequencies with respect to the transmitting signal d. The N subcarrier signals $d_0$ to $d_{N-1}$ are divided into M groups by X adjacent subcarriers. Furthermore, the Sub-band FIR filter 101 receives input of the M filter coefficients w[0] to w[M−1], which are output from the control unit 112. Then, the Sub-band FIR filter 101 superimposes (multiplies) the M filter coefficients w[0] to w[M−1] on the respective subcarrier signals $d_k$ in the M groups.

Figure 10:
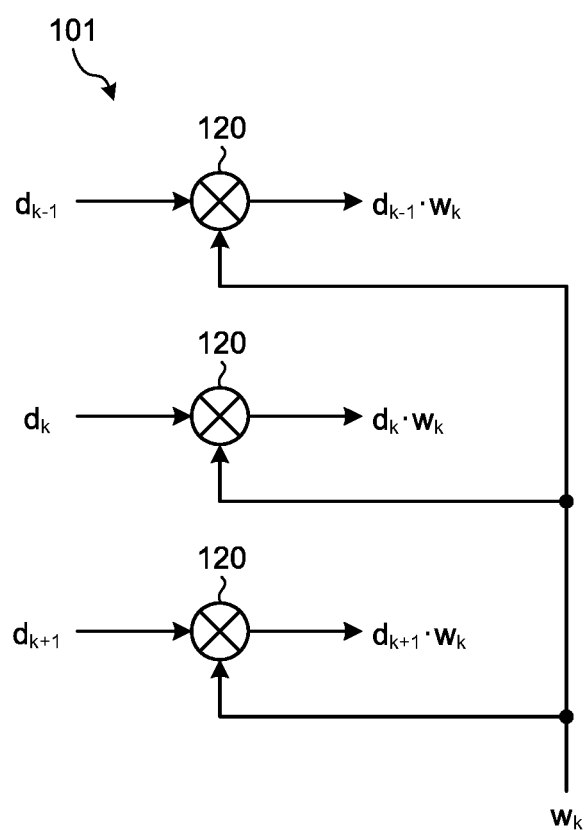
FIG. 10 is a diagram that illustrates an example of the configuration of the Sub-band FIR filter in the distortion compensating device according to the fifth embodiment.

FIG. 10 is a diagram that illustrates an example of the configuration of the Sub-band FIR filter 101 in the distortion compensating device according to the fifth embodiment. As illustrated in FIG. 10, if X=2, the Sub-band FIR filter 101 superimposes (multiplies) the filter coefficient $w_k$, which has the same value, on the subcarrier signals $d_{k-1}$, $d_k$, $d_{k+1}$ in the group.

As described above, with the distortion compensating device according to the fifth embodiment, the number of filter coefficients is reduced from N to M so that the number of filter coefficients may be reduced in X times. For example, as the number of filter coefficients is reduced from 1200 to 8, the number of filter coefficients is reduced in 150 times. For this reason, with the distortion compensating device according to the fifth embodiment, the circuit size of the Sub-band FIR filter 101 may be reduced.

[f] Sixth Embodiment

With the distortion compensating device according to the sixth embodiment, the multiplier 120 in each group in the Sub-band FIR filter 101 illustrated in the fifth embodiment is replaced with a LUT so that the circuit size of the Sub-band FIR filter 101 is further reduced.

Figure 11:
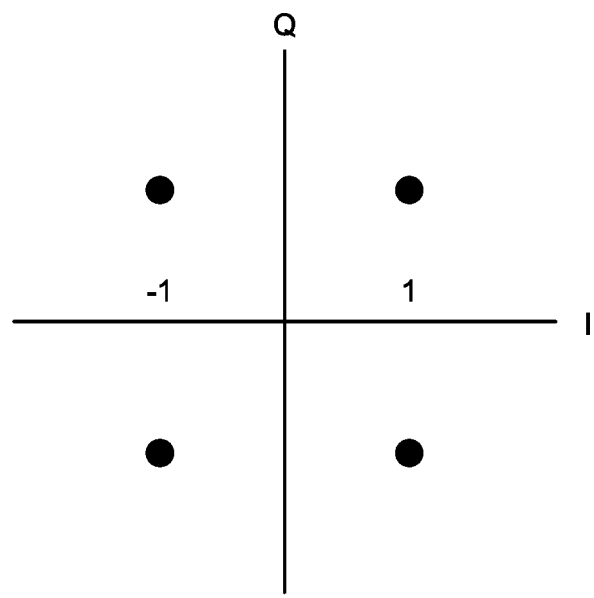
FIG. 11 is a diagram that illustrates an example of QPSK constellation.
Figure 12:
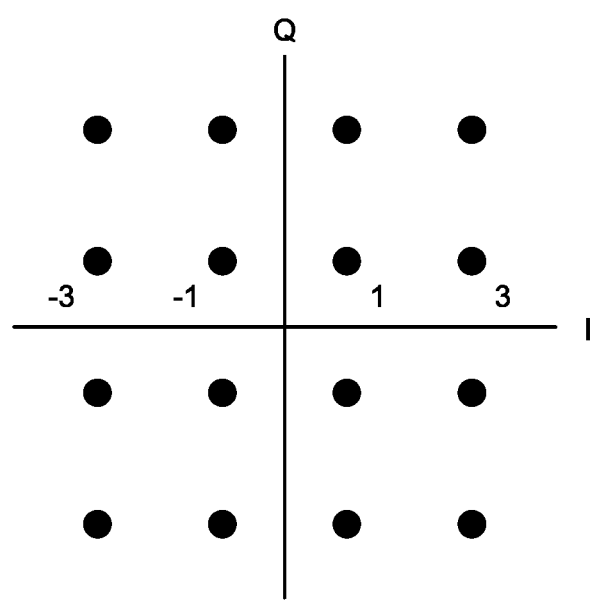
FIG. 12 is a diagram that illustrates an example of 16QAM constellation.

The transmitting signal d, i.e., the subcarrier signal $d_k$, has amplitude. The amplitude value depends on modulation. FIG. 11 and FIG. 12 illustrate the subcarrier signal $d_k$ for Quadrature Phase Shift Keying (QPSK) modulation and the subcarrier signal $d_k$ for 16 Quadrature Amplitude Modulation (QAM) modulation, respectively.

FIG. 11 is a diagram that illustrates an example of QPSK constellation. In FIG. 11, the horizontal axis is the I component of the subcarrier signal $d_k$, and the vertical axis is the Q component of the subcarrier signal $d_k$. As illustrated in FIG. 11, in the QPSK modulation, as $d_k=\{I, Q\}=\{1, \pm1\}$, totally 4 combinations are possible for the subcarrier signal $d_k$.

FIG. 12 is a diagram that illustrates an example of 16QAM constellation. In FIG. 12, the horizontal axis is the I component of the subcarrier signal $d_k$, and the vertical axis is the Q component of the subcarrier signal $d_k$. As illustrated in FIG. 12, in the 16QAM modulation, as $d_k=\{I, Q\}=\{3, \pm 3\}$, totally 16 combinations are possible for the subcarrier signal $d_k$.

Therefore, in the distortion compensating device according to the sixth embodiment, the multiplication product in each of the M groups is pre-calculated for all the combinations (4 in QPSK modulation and 16 in 16QAM modulation) and then it may be applied to the subcarrier signal $d_k$.

For example, it is assumed that the filter coefficient is w[Mx] for 150 subcarriers (X=150) that are adjacent in each group Mx and the transmitting signal d is the subcarrier signal $d_k$ for QPSK modulation. In this case, the multiplication product $d_k$w[Mx] may be represented by the following 4 multiplication products.

$$P_1 = d_k = \{+1, +1\}w$$

$$P_2 = d_k w = \{+1, -1\}W$$

$$P_3 = d_k w = \{-1, +1\}w$$

$$P_4 = d_k w = \{-1, -1\}w$$

The multiplication product $d_k$w[Mx] for 150 subcarriers inside the group Mx can be selected in accordance with the subcarrier signal $d_k$ by using the 4 signals $P=\{P_1, P_2, P_3, P_4\}$ that are pre-calculated. The 4 signals P may be written into the LUT. In this case, the LUT address Addr may be calculated by using the following Equation.

$$\text{Addr} = ((2I+Q)+3)/2$$

Figures 13, 14:
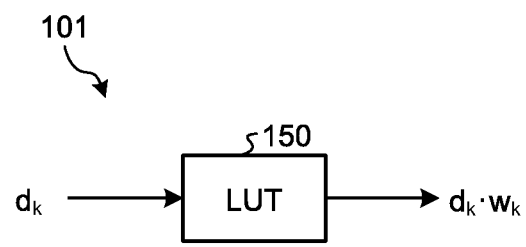
FIG. 13 is a diagram that illustrates an example of the LUT address according to the sixth embodiment.
FIG. 14 is a diagram that illustrates an example of the configuration of the Sub-band FIR filter in the distortion compensating device according to the sixth embodiment.

FIG. 13 is a diagram that illustrates an example of the LUT address according to the sixth embodiment. According to the above equation, if the I component and the Q component of the transmitting signal d, i.e., the subcarrier signal $d_k$, are −1, −1, respectively, the LUT address Addr is "0". Similarly, if the I component and the Q component are −1, +1, respectively, the LUT address Addr is "1". If the I component and the Q component are +1, −1, respectively, the LUT address Addr is "2". If the I component and the Q component are +1, +1, respectively, the LUT address Addr is "3".

Therefore, in the distortion compensating device according to the sixth embodiment, the multiplier 120 in each group Mx of the Sub-band FIR filter 101 is replaceable with a LUT. The number of multiplication per group Mx is 4 for QPSK modulation, 16 for 16QAM modulation, and 64 for 64QAM modulation.

FIG. 14 is a diagram that illustrates an example of the configuration of the Sub-band FIR filter 101 in the distortion compensating device according to the sixth embodiment. The Sub-band FIR filter 101 includes M LUTs 150. The multiplication product $d_k$w[Mx] in each group Mx is mapped to each of the M LUTs 150.

Here, for each group Mx, if a new filter coefficient w[Mx] is obtained, the contents of the LUT 150 are updated.

Here, a case where the control unit 112 has the configuration illustrated in the first embodiment or the second embodiment is assumed. In this case, the error-signal generating unit 132 generates the M error signals $_k$(n) according to the arithmetic equation (the above-described Equation (9)) that uses the above-described M, the subcarrier signals $d_k$ in the M groups, and the signals $\hat{d}_k$ that are converted into a frequency domain for the respective M groups by the FFT unit 131.

The filter-coefficient generating unit 133 generates the M filter coefficients w[Mx] according to the arithmetic equation (the above-described Equation (7)) that uses the M error signals $_k$(n) and the subcarrier signals $d_k$ in the M groups. The filter-coefficient generating unit 133 stores the generated M filter coefficients w[Mx] in the M LUTs 150 of the Sub-band FIR filter 101. Thus, the contents of the LUT 150 are updated.

The Sub-band FIR filter 101 refers to the M tables 150, which are updated by the control unit 112, and superimposes (multiplies) the M filter coefficients w[Mx] on the subcarrier signals $d_k$ in the M groups.

As described above, in the distortion compensating device according to the sixth embodiment, the multiplier 120 in each group of the Sub-band FIR filter 101 is replaced with an LUT, whereby the circuit size of the Sub-band FIR filter 101 may be further reduced.

[g] Seventh Embodiment

In the distortion compensating device according to the first to the fifth embodiments, the Sub-band FIR filter 101 superimposes the filter coefficients $w_0$ to $w_{N-1}$ on the N subcarrier signals $d_0$ to $d_{N-1}$, respectively, regardless of the amplitudes of the subcarrier signals; however, this is not a limitation. In the distortion compensating device according to a seventh embodiment, the Sub-band FIR filter 101 superimposes filter coefficients $w_{0,i}$ to $w_{N-1,i}$ on the N subcarrier signals $d_0$ to $d_{N-1}$, respectively, in accordance with the amplitudes of the respective subcarrier signals.

Figure 15:
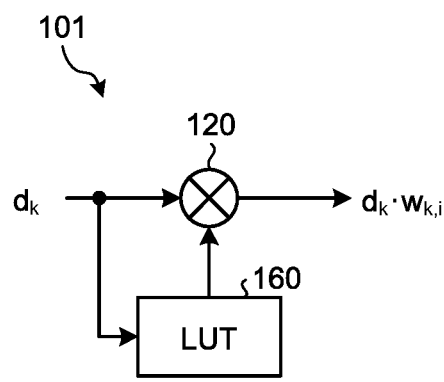
FIG. 15 is a diagram that illustrates an example of the configuration of a Sub-band FIR filter in the distortion compensating device according to a seventh embodiment.

FIG. 15 is a diagram that illustrates an example of the configuration of the Sub-band FIR filter 101 in the distortion compensating device according to the seventh embodiment. In FIG. 15, the same components as those in FIGS. 1 and 2 are attached with the same reference numerals, and their explanations are omitted.

According to the seventh embodiment, the Sub-band FIR filter 101 includes an LUT 160. The LUT 160 stores a filter coefficient $w_{k,i}$ in relation to the amplitude of the subcarrier signal $d_k$. Furthermore, when the N subcarrier signals $d_0$ to $d_{N-1}$ are input to the Sub-band FIR filter 101, the LUT 160 outputs the filter coefficients $w_{0,i}$ to $w_{N-1,i}$ that correspond to the respective amplitudes to the corresponding multipliers 120.

When the modulation method for the subcarrier signal $d_k$ is BPSK (Binary Phase Shift Keying) or QPSK, the amplitude of the subcarrier signal $d_k$ is constant; however, when a modulation method with large modulation levels, such as 16QAM and 64QAM, is used, the amplitude of the subcarrier signal $d_k$ is not constant.

Figure 16:
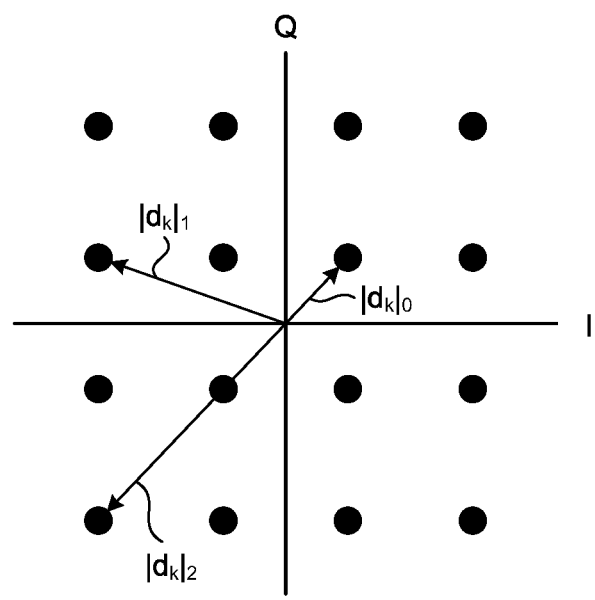
FIG. 16 is a diagram that illustrates the amplitudes of symbols that are modulated by 16QAM.

Specifically, as illustrated in FIG. 16, for example, when the modulation method is 16QAM, three types of amplitudes, $|d_k|_0$, $|d_k|_1$, and $|d_k|_2$, of the symbol are obtained due to modulation. Similarly, when the modulation method is 64QAM, for example, 10 types of amplitudes of the symbol are obtained due to modulation. Thus, as the amplitude of the subcarrier signal $d_k$ changes in accordance with a modulation method, the LUT 160 stores the filter coefficient that corresponds to each amplitude.

Figures 17, 18:
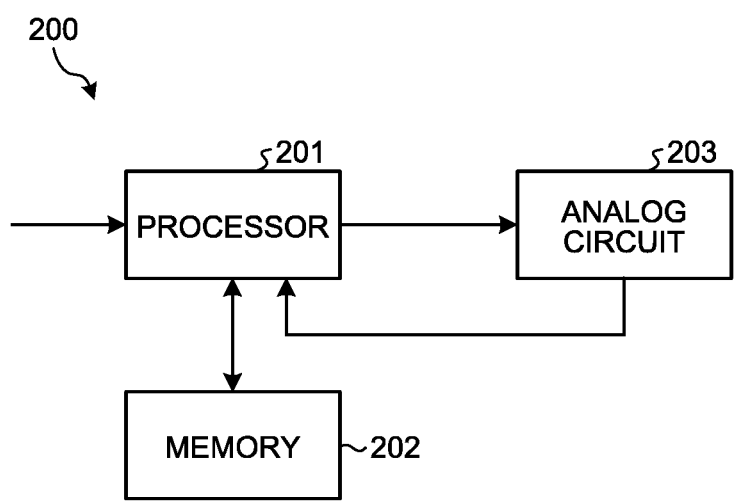
FIG. 17 is a diagram that illustrates an example of the LUT according to the seventh embodiment.
FIG. 18 is a diagram that illustrates an example of the hardware configuration of the transmitting device.

FIG. 17 is a diagram that illustrates an example of the LUT 160. FIG. 17 illustrates an example of the LUT 160 when the modulation method for the subcarrier signal $d_k$ is 16QAM. As described above, when the modulation method is 16QAM, three types of amplitudes of the symbol are obtained due to modulation, and therefore filter coefficients $w_{k,0}$, $w_{k,1}$, and $w_{k,2}$ are stored in relation to the three different amplitudes $|d_k|_0$, $|d_k|_1$, and $|d_k|_2$, respectively. Furthermore, the LUT 160 outputs the filter coefficient corresponding to the amplitude of the input subcarrier signal $d_k$ to the multiplier 120.

Furthermore, the control unit 112 according to the seventh embodiment generates the filter coefficients $w_{0,i}$ to $w_{N-1,i}$ that correspond to the amplitudes of the respective input subcarrier signals $d_0$ to $d_{N-1}$ and stores them in relation to the amplitudes of the respective subcarrier signals $d_0$ to $d_{N-1}$ in the LUT 160. The method for the control unit 112 to generate the filter coefficients $w_{0,i}$ to $w_{N-1,i}$ is the same as those according to the first to the sixth embodiments.

As described above, in the distortion compensating device according to the seventh embodiment, each filter coefficient is stored for the amplitude of a subcarrier signal, and the filter coefficient corresponding to the amplitude of a subcarrier signal is superimposed on the subcarrier signal. Thus, distortion compensation may be conducted in accordance with the characteristics of a subcarrier signal, and a distortion compensation performance may be improved when a modulation method with large modulation levels is used. That is, when a modulation method such as 16QAM, 64QAM, or 256QAM is used, EVM and ACLR may be improved.

Other Embodiments

Components of each unit illustrated in the embodiments do not necessarily need to be physically configured as illustrated in the drawings. Specifically, specific forms of separation and combination of each unit are not limited to those depicted in the drawings, and a configuration may be such that all or some of them are functionally or physically separated or combined in an arbitrary unit depending on various types of loads or usage.

Furthermore, all or any of various processes performed by each device may be implemented by a CPU (Central Processing Unit) (or a microcomputer such as a Micro Processing Unit (MPU) or a Micro Controller Unit (MCU)). Furthermore, all or any of various processes may be implemented by programs analyzed and executed by a CPU (or a microcomputer such as an MPU or MCU) or by wired logic hardware.

The transmitting device including the distortion compensating device according to the embodiment may be implemented by, for example, the following hardware configuration.

FIG. 18 is a diagram that illustrates an example of the hardware configuration of a transmitting device including the distortion compensating device. As illustrated in FIG. 18, a transmitting device 200 includes a processor 201, a memory 202, and an analog circuit 203. Examples of the processor 201 include a CPU, Digital Signal Processor (DSP), or a Field Programmable Gate Array (FPGA). Furthermore, examples of the memory 202 include a Random Access Memory (RAM), such as a Synchronous Dynamic Random Access Memory (SDRAM), a Read Only Memory (ROM), or a flash memory.

Moreover, various processes performed by the transmitting device 100 according to the embodiment may be implemented as the processor executes programs stored in various memories, such as non-volatile storage medium. Specifically, the memory 202 may store programs that correspond to various processes executed by a digital processing unit of the transmitting device 100 so that each program is executed by the processor 201. The digital processing unit of the transmitting device 100 includes, for example, the Sub-band FIR filter 101, the IFFT unit 102, the oversampling unit 103, the CFR unit 104, the M-L DPD unit 105, and the control unit 112. In this case, the DAC 106, the up converter 107, the HPA 108, the directional coupler 109, the down converter 110, and the ADC 111 of the transmitting device 100 are implemented by the analog circuit 203.

Furthermore, here, various processes, performed by the transmitting device 100 according to the embodiment, are executed by the processor 201; however, this is not a limitation, and they may be executed by multiple processors.

According to one aspect, it is possible to prevent an increase in the power consumption, which is consumed during signal processing for distortion compensation.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensating device comprising:
a filter that receives input of a transmitting signal including a plurality of subcarrier signals assigned to respective frequencies and that superimposes filter coefficients on the respective subcarrier signals;
a first signal converting unit that converts the subcarrier signals, on which the respective filter coefficients are superimposed, from a frequency domain into a time domain to obtain an input signal;
a distortion compensating unit that superimposes a distortion compensation coefficient on the input signal to obtain an output signal;
a power amplifier that amplifies and outputs the output signal; and
a control unit that generates the filter coefficients according to an arithmetic equation using the subcarrier signals and a feedback signal from the power amplifier, and outputs the filter coefficients to the filter.

2. The distortion compensating device according to claim 1, wherein the control unit includes:
a second signal converting unit that converts the feedback signal from a time domain into a frequency domain;
an error-signal generating unit that generates, as a plurality of error signals, differences between the subcarrier signals and signals converted into the frequency domain; and
a filter-coefficient generating unit that generates the filter coefficients according to an arithmetic equation using the error signals and the subcarrier signals.

3. The distortion compensating device according to claim 2, wherein
the control unit includes:
a band limiting unit that passes a signal in a specific frequency band with regard to the feedback signal; and
a decimation unit that decimates the feedback signal passing the band limiting unit, and outputs the decimated feedback signal to the second signal converting unit.

4. The distortion compensating device according to claim 1, wherein
the control unit includes:

an error-signal generating unit that generates an error signal that indicates a difference between the input signal and the feedback signal;

a second signal converting unit that converts the error signal from a time domain into a frequency domain to generate a plurality of error signals; and a filter-coefficient generating unit that generates the filter coefficients according to an arithmetic equation using the error signals and the subcarrier signals.

5. The distortion compensating device according to claim 2, wherein the control unit generates the distortion compensation coefficient according to an arithmetic equation using the input signal and a sum of the error signals.

6. The distortion compensating device according to claim 4, wherein the control unit generates the distortion compensation coefficient according to an arithmetic equation using the input signal and a sum of the error signals.

7. The distortion compensating device according to claim 5, further comprising a suppressing unit that suppresses a peak power of the input signal, wherein
the control unit generates the distortion compensation coefficient according to an arithmetic equation using the input signal whose peak power is suppressed by the suppressing unit and a sum of the error signals.

8. The distortion compensating device according to claim 6, further comprising a suppressing unit that suppresses a peak power of the input signal, wherein
the control unit generates the distortion compensation coefficient according to an arithmetic equation using the input signal whose peak power is suppressed by the suppressing unit and a sum of the error signals.

9. The distortion compensating device according to claim 2, wherein
N subcarrier signals, which are the subcarrier signals, are divided into M groups by X adjacent subcarriers (N, X, and M are integers that satisfy M=N/X),
the control unit
generates M error signals that are each set to an identical value for the X adjacent subcarriers in each group as the error signals according to an arithmetic equation using M, and
generates M filter coefficients as the filter coefficients according to an arithmetic equation using the M error signals and the subcarrier signals in the M groups, and
the filter unit superimposes the M filter coefficients on the respective subcarrier signals in the M groups.

10. The distortion compensating device according to claim 9, wherein
the filter unit includes M tables in which a multiplication product in each group is mapped,
the control unit stores the M filter coefficients in the respective M tables, and
the filter unit refers to the M tables updated by the control unit and superimposes the M filter coefficients on the respective subcarrier signals in the M groups.

11. The distortion compensating device according to claim 1, wherein
the filter unit includes a storage unit that stores a filter coefficient corresponding to an amplitude of a subcarrier signal and outputs filter coefficients stored in relation to amplitudes of the respective subcarrier signals, and
superimposes the filter coefficients output from the storage unit on the subcarrier signals.

12. A distortion compensation method comprising:
receiving input of a transmitting signal including a plurality of subcarrier signals assigned to respective frequencies and superimposing filter coefficients on the respective subcarrier signals;
converting the subcarrier signals, on which the respective filter coefficients are superimposed, from a frequency domain into a time domain;
conducting oversampling on the signal, which has been converted into the time domain, and outputting it as an input signal;
superimposing a distortion compensation coefficient on the input signal and outputting it as an output signal to a power amplifier; and
generating the filter coefficients according to an arithmetic equation that uses the subcarrier signals and a feedback signal from the power amplifier.

* * * * *